(12) United States Patent
Kawai

(10) Patent No.: US 6,870,447 B2
(45) Date of Patent: Mar. 22, 2005

(54) TUNING CIRCUIT

(75) Inventor: Kazuo Kawai, Tokyo (JP)

(73) Assignee: General Research of Electronics, Inc., Tokyo (JP)

( * ) Notice: Subject to any disclaimer, the term of this patent is extended or adjusted under 35 U.S.C. 154(b) by 0 days.

(21) Appl. No.: 10/633,387

(22) Filed: Aug. 1, 2003

(65) Prior Publication Data
US 2004/0041669 A1 Mar. 4, 2004

(30) Foreign Application Priority Data
Sep. 3, 2002 (JP) .......................... 2002-257367

(51) Int. Cl.⁷ .......................... H03H 11/52; H03F 21/00
(52) U.S. Cl. ..................... 333/217; 333/213; 330/61 A; 330/104
(58) Field of Search ................... 333/213, 214, 333/215, 216, 217; 331/116 R; 330/61 A, 103, 104, 182, 293

(56) References Cited

U.S. PATENT DOCUMENTS 6,573,788 B2 * 6/2003 Oppelt .................... 330/61 A 2004/0017273 A1   1/2004   Kawai

* cited by examiner

Primary Examiner—Robert Pascal
Assistant Examiner—Dean Takaoka
(74) Attorney, Agent, or Firm—Flynn, Thiel, Boutell & Tanis, P.C

(57) ABSTRACT

A tuning circuit using a negative resistance circuit for compensating an equivalent series resistance component thereof is provided. The negative resistance circuit has simple circuit construction and design and adjustment thereof is easy. The tuning circuit comprises a series resonance circuit and a negative resistance circuit connected to the series resonance circuit in series. In the negative resistance circuit, a first transistor constitutes an inverse amplifier by providing a resistor in an emitter circuit thereof and a second transistor constitutes an emitter follower circuit. A positive feedback circuit is constituted by feeding back an output of the emitter follower circuit to an emitter circuit of the first transistor and a negative feedback circuit is constituted by feeding back an output terminal to a base circuit of the first transistor. Thus a negative resistance is produced between this base input terminal and an earth. In this case, since a desired negative resistance value is obtained by adjusting a feedback quantity of both the feedback circuits, Q of the tuning circuit can be set to a desired value.

7 Claims, 4 Drawing Sheets

TUNING CIRCUIT

BACKGROUND OF THE INVENTION

1. Field of the Invention

The present invention relates to circuit construction of a tuning circuit to improve frequency selectivity thereof by using a negative resistance circuit.

2. Description of the Related Art

As a method for improving frequency selectivity of a tuning circuit there are methods for improving Q of the tuning circuit by a negative resistance circuit and one of them is a method for compensating equivalent series resistance component of a tuning circuit by constituting it so that an inductor is connected to a capacitor in series and an input signal are applied to one side thereof, and the other side is earthed through a negative resistance circuit. Compensation of the equivalent series resistance component is done to obtain the following two merits. That is, one of them is a merit able to keep a 3 dB band width constant because a value of $\omega L$ is changed by changing a tuning frequency but Q changes in proportion to a frequency ($Q=\omega L/r$) since an equivalent series resistance component r does not change and the other is a merit that if a current component is taken out as an output of a tuning circuit, a maximum value at a tuning point, that is, a circuit gain of the tuning circuit is constant in dependently to frequency.

A negative resistance is provided by an amplifier having a positive feedback circuit and thus a negative resistance circuit can be constituted by the positive feedback circuit, but the circuit becomes unstable due to existence of the positive feedback circuit. In order to suppress this and obtain a stable positive feedback operation, a negative feedback circuit as well as a positive feedback circuit should be used. Circuits according to various methods such as a negative resistance circuit are known, but circuits of which design and adjustment are easy, suitable operation in a high frequency band is possible, and circuit construction is simple are very few. So, the inventor has filed Japanese Patent Application No. 2002-218036 as a construction plan of a tuning circuit, which corresponds to U.S. Patent Application Ser. No. 10/454,724, filed on Jun. 4, 2003 and published as U.S. Patent Publication No. 2004/0017273.

The tuning circuit of the above application includes a differential amplifying circuit having two transistors of which emitters are directly coupled and a low impedance output circuit such as an emitter follower. An output signal of the emitter follower is fed back to a same phase input side of the differential amplifying circuit directly and further is fed back to an inverse phase input side through a negative resistance value setting resistor therefrom to obtain a negative resistance between a inverse phase input terminal and an earth. Since this circuit is constituted by only well known usable circuits, circuit design and adjustment thereof is easy and it operates stably up to a comparatively high frequency because of a simple circuit.

However, since this negative resistance circuit requires at least three transistors, in order to make it operable up to further high frequency, it is necessary to make its circuit construction simple so as to reduce phase rotation quantity in the inside thereof and for this reason it is desirable to reduce the number of transistors further.

SUMMARY OF THE INVENTION

The object of the present invention is to provide a tuning circuit of which circuit construction is simple and circuit design and adjustment is easy as a circuit for compensating an equivalent series resistance component of a tuning circuit of series resonance type by using a negative resistance circuit.

In order to attain the above object, the present invention is characterized by a tuning circuit including a series resonance circuit, a driving circuit connected to one end thereof and a negative resistance circuit connected to the other end thereof. The negative resistance circuit comprises an inverse amplifying circuit and a low output impedance circuit of non-inverse type connected to the inverse amplifying circuit. An output of the low output impedance circuit is fed back to an input of the inverse amplifying circuit to constitute a negative feedback circuit and an output of the low output impedance circuit is fed back to a same phase side output of the inverse amplifying circuit to constitute a positive feedback circuit.

In the tuning circuit of the present invention, the following constructions can be employed, (1) The inverse amplifying circuit comprises a first transistor of which an emitter circuit has a resistor and the low output impedance circuit is an emitter follower circuit comprising a second transistor.

(2) The negative feedback circuit is so constituted that an output of the emitter circuit of the second transistor is fed back to a base of the first transistor and the positive feedback circuit is so constituted that the output of the emitter circuit of the second transistor is fed back to an emitter of the first transistor.

(3) A bias current from a power supply voltage is applied to the second transistor by dividing resistors and the positive feedback circuit is so constituted that direct feedback from the emitter circuit of the second transistor is done.

(4) The first and second transistors include an emitter resistor respectively and the positive feedback circuit is connected through both the emitter resistors.

(5) A collector of the first transistor is directly coupled with a base of the second transistor and a capacitor is inserted in the positive feedback circuit.

(6) The positive feedback circuit is so constituted that the positive feedback from the emitter of the second transistor to the emitter of the first transistor is done and the negative feedback circuit is so constituted that the negative feedback from the emitter of the first transistor to the base thereof is done.

DESCRIPTION OF THE PREFERRED EMBODIMENTS

Figure 1:
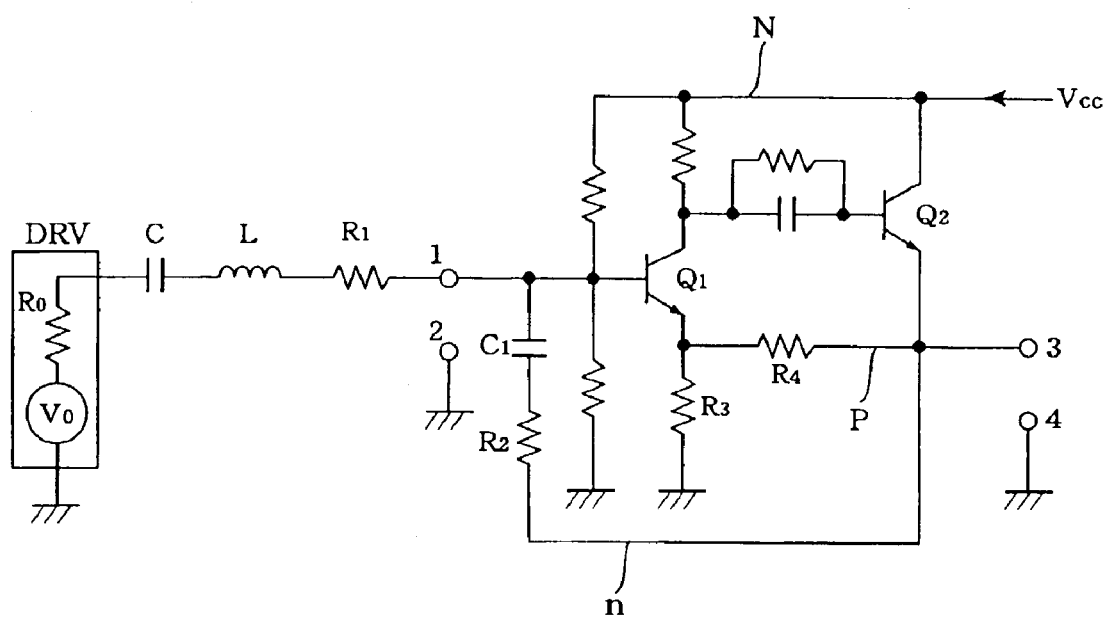
FIG. 1 is a circuit construction diagram showing an embodiment of the present invention.

A tuning circuit of the present invention is so constituted that a current component may be taken out by applying an input signal to an end of a series connected circuit consisting of an inductor and a capacitor and earthing the other end thereof through a negative resistance circuit to compensate a series resistance component from the above described reason.

Therefore, if the negative resistance circuit is constituted by a two stage transistor amplifying circuit, the negative resistance circuit requires the following requirements.

That is, since an input terminal of a forward stage circuit thereof (an input terminal of the negative resistance circuit) is connected to a tuning circuit, it is necessary that an input resistance of this circuit becomes a negative resistance. Further, if this circuit is an inverse amplifying circuit, a circuit following to this must be constituted so as to have construction of non-inverse amplification and low impedance output. If a two stage circuit is constituted in this way, a feedback from an low impedance output terminal of a backward stage to an input terminal of a forward stage becomes a negative feedback and a feedback from a low impedance output terminal of the backward stage becomes a positive feedback. Thus a negative resistance circuit can be constituted by at least two transistor circuits according to the above construction.

A tuning circuit of the present invention based on the above described principle will be explained in detail by referring to the drawings.

FIG. 1 is a circuit diagram of a tuning circuit showing an embodiment of the present invention. In FIG. 1, DRV is a driving circuit of the tuning circuit, $V_0$ is a driving power voltage, $R_0$ is an inside resistance. C, L and $R_1$ are a tuning capacitor, a tuning inductor and an equivalent series resistance component respectively constituting a series resonance circuit. 1 and 2 are input terminals of a negative resistance circuit N and a series resistance component $R_0+R_1$ is compensated by this circuit N, in which 3 and 4 are output terminals. The negative resistance circuit N is constituted by two transistor circuits $Q_1$ and $Q_2$. The forward stage transistor $Q_1$ is an inverse amplifier having a resistor in an emitter circuit thereof and the backward stage transistor $Q_2$ is an emitter follower circuit for providing a low output impedance. In the embodiment of FIG. 1, a positive feedback circuit p is so constituted that an emitter output of the backward transistor $Q_2$ is fed back to the forward emitter output (a same phase output) through a resistor $R_4$ and a negative feedback circuit n is so constituted that said emitter output is fed back to a base of the forward transistor $Q_1$ through $R_2$ and $C_1$.

Figure 2:
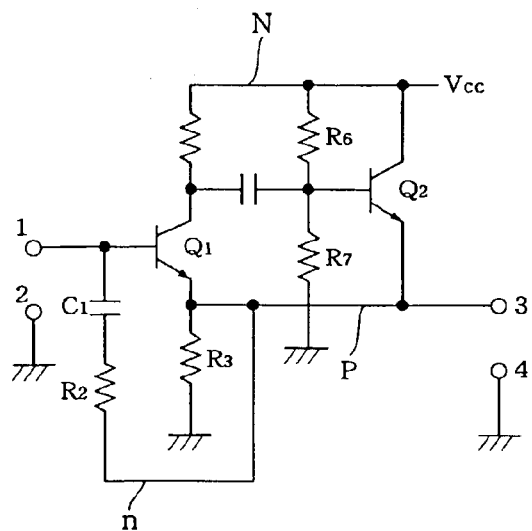
FIGS. 2(a) to 2(d) are circuit diagrams showing negative resistance circuits usable in the present invention.
Figure 2:
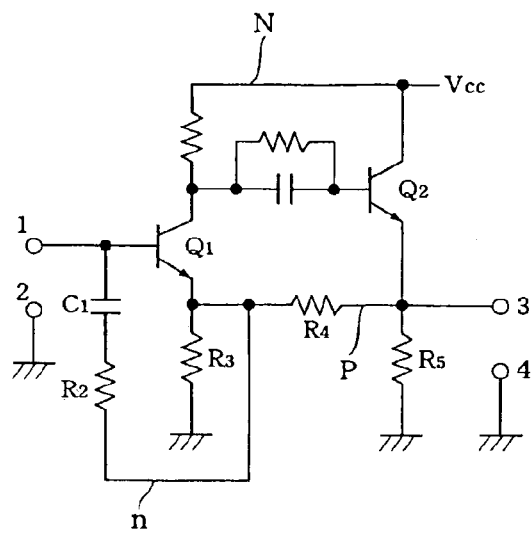
Figure 2:
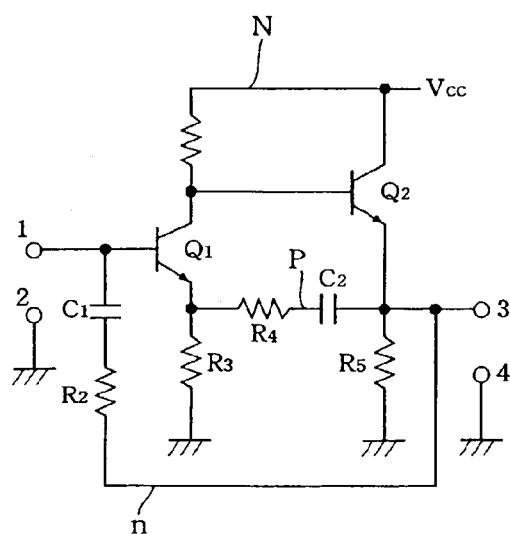
Figure 2:
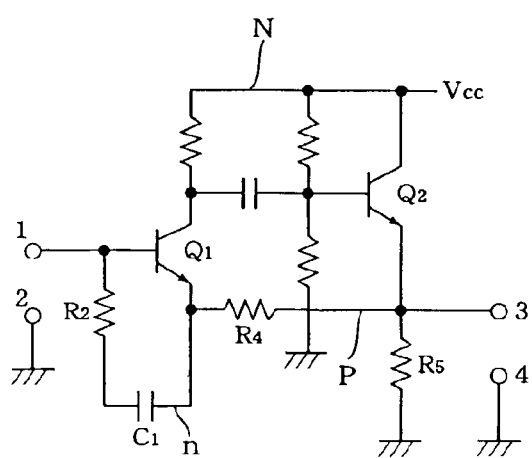

As to a method for connecting between the forward and backward transistor circuits $Q_1$, $Q_2$ and a method for constituting the positive and negative feedback circuits, various methods are considered other than the method of FIG. 1. That is, various constructions can be employed by a bias current supplying method of the backward transistor $Q_2$ and a method of the positive and negative feedbacks and some examples thereof as shown in FIG. 2.

FIG. 2(a) shows a case that a bias current of the backward transistor $Q_2$ is supplied by resistor dividing due to resistors $R_6$ and $R_7$ from a power supply voltage Vcc.

FIG. 2(c) shows a case that a collector output of the forward transistor $Q_1$ is connected to the backward transistor $Q_2$ directly.

Further, as to a feedback circuit, FIG. 2(a) shows a case that 100% positive feedback is done by connecting the output of the backward transistor $Q_2$ to the forward transistor $Q_1$ directly.

FIG. 2(b) shows a case that a positive feedback circuit p is constituted by inserting a resistor $R_4$ between an emitter resistor $R_3$ of the forward transistor $Q_1$ and an emitter resistor $R_5$ of the backward transistor $Q_2$ and a negative feedback circuit is constituted by inserting $C_1$ and $R_2$ between an emitter of the forward transistor $Q_1$ and a base thereof.

FIG. 2(c) shows a case that positive feedback of a d.c. component is blocked by inserting $C_2$ into a positive feedback circuit p.

FIG. 2(d) shows a case that a positive feedback circuit p is constituted by a resistor $R_4$ and a negative feedback circuit n is constituted by connecting an emitter of a forward transistor $Q_1$ to a base thereof.

Figure 3:
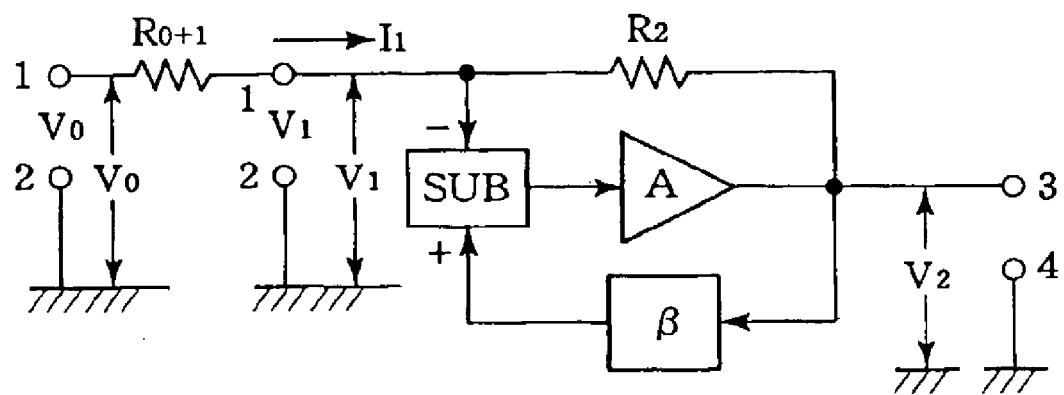
FIG. 3 is an equivalent circuit diagram for explaining operation principle of the present invention.

The tuning circuit of FIGS. 1 and 2 can be represented by blocks as shown in FIG. 3 in accordance with functions thereof. In FIG. 3, $R_{0+1}$ indicates sum $R_0+R_1$ of an inside resistor $R_0$ of the driving source and a series resistance component $R_1$ of the tuning circuit. SUB indicates subtracting function of the negative resistance circuit N. A is an amplification factor of the first amplifier $Q_1$ and $\beta$ is a feedback factor, that is, $$\beta = \frac{R_3}{R_3 + R_4}$$

in FIG. 1 but $\beta=1$ in FIG. 2(a).

In FIG. 3 the following equation can be realized.

$$I_1 + \frac{V_2 - V_1}{R_2} = 0 \qquad (1)$$

$$V_2 = (V_2\beta - V_1)A \qquad (2)$$

An input resistance of the circuit of FIG. 3 that is, an input resistance of the negative resistance circuit N is represented by the following equation.

$$\frac{V_1}{I_1} = R_2 \frac{1 - \beta A}{1 + A(1 - \beta)} \qquad (3)$$

Therefore, when $1<\beta A$, the input resistance becomes negative and its resistance value can be set by $R_2$.

An amplifying factor from the driving source to the output terminal 3, 4 at a tuning point is obtained from FIG. 3 easily and is represented by the following equation.

$$\frac{V_2}{V_0} = \frac{R_2}{\{\beta - (1/A)\}(R_{0+1} + R_2) - R_{0+1}} \qquad (4)$$

Figure 4:
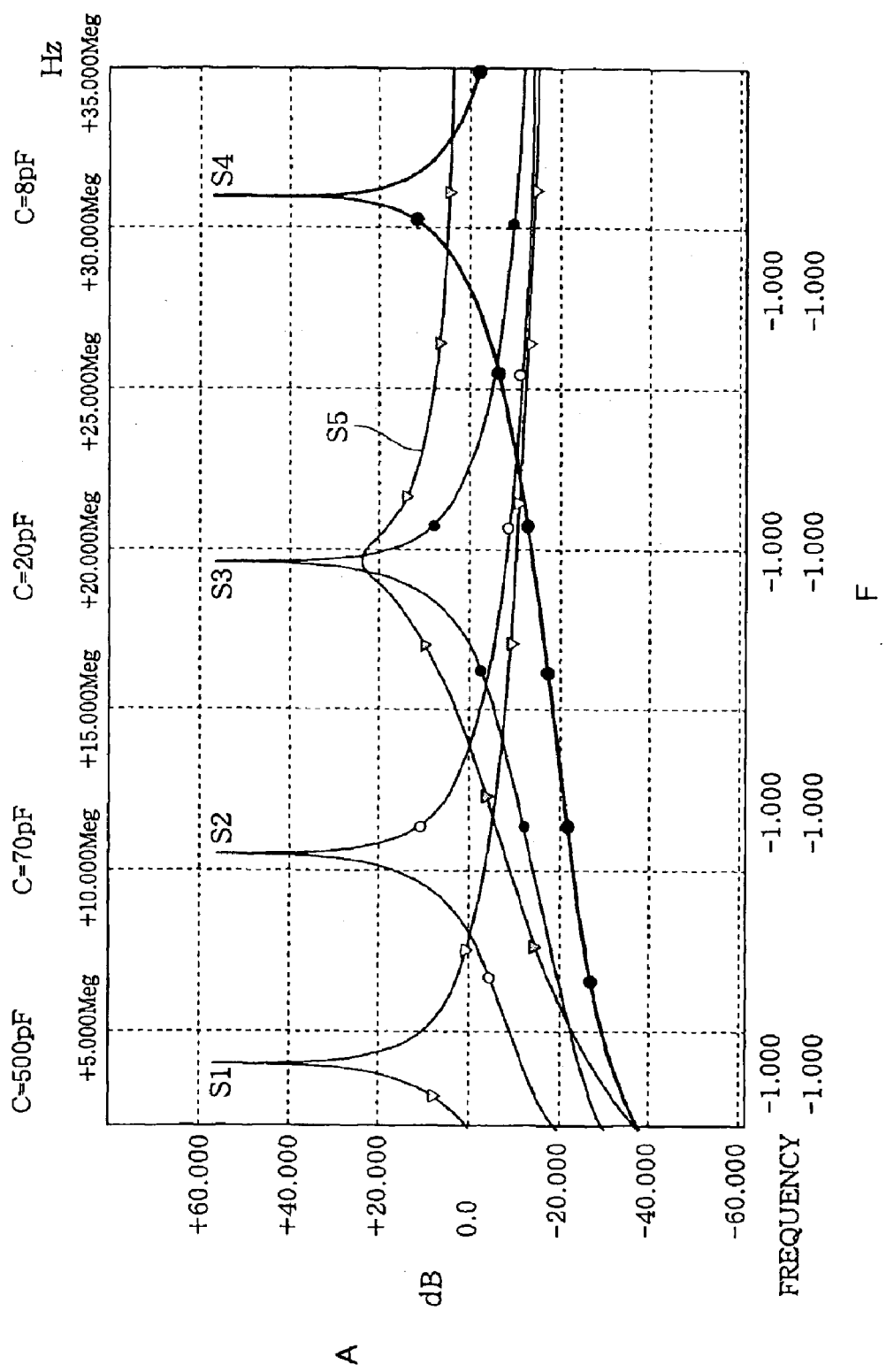
FIG. 4 is a simulation curve showing effect of the present invention.

FIG. 4 shows frequency selectivity characteristic curves $S_1$ to $S_4$ when only C of the series resonance circuit is varied from 500 pF to 70 pF, 20 pF, 8 pF at L=3.3 $\mu$H, $R_{0+1}$=20 $\Omega$ in the circuit of FIG. 1 and for comparison, an example $S_5$ of simulation result of a frequency selectivity characteristic at a case that a negative resistance circuit is not used. In FIG. 4, A is an attenuation quantity (dB) and F is frequency (Hz). It can be understood from FIG. 4 that a path band width, that is, a frequency selectivity characteristic is constant and a tuning circuit gain is kept constant even if a tuning frequency is changed by changing a capacitance of the capacitor C.

As described above in details, according to a tuning circuit of the present invention using a negative resistance circuit, Q can be increased by a very simple circuit and a tuning frequency can be changed while a path band, that is, a frequency selectivity characteristic is constant even if capacity of a capacitance C is changed to change the tuning frequency, and at this time, a tuning circuit gain is constant.

What is claimed is:

1. A tuning circuit comprising a series resonance circuit, a driving circuit connected to one end thereof and a negative resistance circuit connected to the other end thereof, said negative resistance circuit including an inverse amplifying circuit connected to the negative resistance circuit; a non-inverse type low output impedance circuit connected to the inverse amplifying circuit; a negative feedback circuit for feeding back an output of the low output impedance circuit to an input of the inverse amplifying circuit; and a positive feedback circuit for feeding back the output of the low output impedance circuit to a same phase side output of the inverse amplifying circuit.

2. A tuning circuit according to claim 1 wherein said inverse amplifying circuit comprises a first transistor having a resistor in an emitter circuit thereof and said low output impedance circuit includes an emitter follower circuit having a second transistor.

3. A tuning circuit according to claim 2 wherein said negative feedback circuit is so constituted that an output of the emitter circuit of the second transistor is fed back to a base of the first transistor and the positive feedback circuit is so constituted that the output of the emitter circuit of the second transistor is fed back to an emitter of the first transistor.

4. A tuning circuit according to claim 3 wherein a bias current is supplied to said second transistor by resistor dividing and said positive feedback circuit is so constituted that the emitter of the second transistor is fed back to the emitter of the first transistor directly.

5. A tuning circuit according to claim 3 wherein the first and second transistors include emitter resistors respectively and said positive feedback circuit includes both the emitter transistors.

6. A tuning circuit according to claim 5 wherein a collector of the first transistor is coupled with a base of the second transistor directly and a capacitor is inserted into the positive feedback circuit.

7. A tuning circuit according to claim 2 wherein said positive feedback circuit is so constituted that the emitter of the second transistor is fed back to the emitter of the first transistor through a resistor and said negative feedback circuit is so constituted that the emitter of the first transistor is fed back to a base thereof.

* * * * *